United States Patent [19]
Sanford

[11] Patent Number: 6,097,349
[45] Date of Patent: Aug. 1, 2000

[54] COMPACT ANTENNA FEED CIRCUITS

[75] Inventor: Gary G. Sanford, Apex, N.C.

[73] Assignee: Ericsson Inc., Research Triangle Park, N.C.

[21] Appl. No.: 09/020,120

[22] Filed: Feb. 6, 1998

Related U.S. Application Data

[60] Provisional application No. 60/065,633, Nov. 18, 1997.

[51] Int. Cl.[7] .................................. H01Q 1/46; H01P 5/10
[52] U.S. Cl. ........................ 343/859; 343/895; 343/789; 333/26
[58] Field of Search ....................... 333/25, 26; 343/859, 343/895, 789

[56] References Cited

U.S. PATENT DOCUMENTS

| | | | |
|---|---|---|---|
| 2,013,154 | 9/1935 | Jensen | 333/25 |
| 2,227,487 | 1/1941 | Chaffee | 333/25 |
| 2,327,418 | 8/1943 | Goldmann . | |
| 2,606,964 | 8/1952 | Gluyas, Jr. . | |
| 3,129,393 | 4/1964 | Coleman | 333/26 |
| 3,618,105 | 11/1971 | Bruene et al. | 343/747 |
| 3,656,071 | 4/1972 | Woodward | 333/26 |
| 5,003,622 | 3/1991 | Ma et al. | 455/327 |
| 5,115,214 | 5/1992 | Gassmann et al. | 333/26 |
| 5,594,461 | 1/1997 | O'Neill, Jr. | 343/895 |
| 5,644,272 | 7/1997 | Drabowski | 333/26 |

FOREIGN PATENT DOCUMENTS

| | | |
|---|---|---|
| 881 078 | 5/1953 | Germany . |
| 890 070 | 8/1953 | Germany . |

OTHER PUBLICATIONS

International Search Report, PCT/US98/24548, Mar. 4, 1999.

*Primary Examiner*—Benny T. Lee
*Attorney, Agent, or Firm*—Myers Bigel Sibley & Sajovec

[57] ABSTRACT

A feed circuit connects an antenna to a communications circuit to achieve an increased operating bandwidth. The feed circuit includes a folded balun having a balanced port configured to connect the antenna and an unbalanced port configured to connect to the communications circuit. In addition, a resonating capacitance is connected across the balanced port of the folded balun. The resonating capacitance has a value that provides resonance with an inductance of the balun in such a way that the operating bandwidth of the combined feed circuit and antenna is increased.

19 Claims, 10 Drawing Sheets

COMPACT ANTENNA FEED CIRCUITS

RELATED APPLICATIONS

This application claims the benefit of U.S. Provisional Application No. 60/065,633, entitled "Compact Feed Circuit for an Antenna" filed on Nov. 18, 1997, which is hereby incorporated herein in its entirety by reference.

FIELD OF THE INVENTION

The present invention relates to communications equipment and methods, and more particularly, to antenna circuits.

BACKGROUND OF THE INVENTION

Resonant quadrifilar helical antennas were first developed by C. C. Kilgus in the late 1960's (see Kilgus, C. C., "Resonant Quadrifilar Helix," IEEE Transactions on Antennas and Propagation, Volume AP-17, May 1969, pages 349–351). In succeeding years this type of antenna has been used in many different applications including hand-held user terminals for satellite communication systems. It is particularly well suited to this application because its radiation pattern can be tailored to the required overhead coverage volume and because its pattern is relatively independent of the shape of any associated ground structure.

However, quadrifilar helix antennas may provide limited bandwidth in such applications. Although the bandwidth of the quadrifilar helix typically is as good as any other small resonant antenna occupying an equivalent volume, the natural bandwidth of the helix is often inadequate. Although the antenna's bandwidth may be increased by increasing the volume occupied by the antenna, this approach may be limited for mechanical and aesthetic reasons.

A very similar problem may occur when the communication system is designed to operate in two separate bands. For example, the antenna of a terminal may need to operate in transmit and receive bands which are separated by an unused band. The antenna may have adequate bandwidth for one band, but may not be adequate to encompass the other band. This represents a minor variation of the basic problem of inadequate bandwidth. It can be addressed by circuit concepts that solve the problem of inadequate bandwidth.

The above-described problem may be compounded by the need to provide a feed circuit. The feed circuit may consume some of the volume that could otherwise be used by the radiating structure. The volume of the feed circuit is often dominated by some form of balun structure. As indicated in Johnson's *Antenna Engineering Handbook*, most baluns tend to have at least one dimension equal to a quarter wavelength or more. The other two dimensions of a balun are often in excess of 0.05 wavelength, especially in a four-phase balun of the type often used in the feed of a circularly polarized antenna. A feed circuit including such a balun may consume 25 to 50% of the available volume. There are small transformer baluns commercially available that could potentially solve the problem, but many of these have been found to perform rather poorly in terms of insertion loss, amplitude balance, and phase balance. In addition, attempting to reduce the size of the balun often introduces an unwanted inductive susceptance across the feed points of the antenna.

A conventional approach to providing broad band or dual band capability is described in Johnson's *Antenna Engineering Handbook*. This approach includes the addition of a parallel resonant circuit to a series resonant antenna, such as the quadrifilar helix, to increase the bandwidth of the antenna. The same circuit can provide a dual band response if the resonant resistance of the antenna and the capacitance and the inductance of the parallel resonant circuit are appropriately adjusted. Although the addition of a parallel resonant circuit can be quite effective, the capacitance needed tends to be relatively large and the inductor relatively small, which may make it difficult to utilize standard components.

Another solution to the balun size problem is to simply eliminate the balun. The resulting antenna circuit may still function reasonably well, but the unbalanced feed typically causes currents to flow on the outer conductor of the coaxial feed, thereby skewing the radiation pattern and causing the pattern to vary as a function of frequency. These effects may be unacceptable in some applications.

SUMMARY OF THE INVENTION

In light of the foregoing, it is an object of the present invention to provide antenna feed circuits that are capable of providing wide band and dual band response.

It is another object of the present invention to provide compact antenna feed circuits.

It is yet another object of the present invention to provide antenna feed circuits that can be implemented using components with practical component values.

These and other objects, features and advantages are provided according to the present invention by antenna feed circuits that include a folded balun having a balanced port across which a resonating capacitance is connected. The presence of the resonating capacitor allows the balun to be shortened to an electrical length substantially less than one-quarter of the nominal operating wavelength of the combination of the feed circuit, antenna and communication circuit. The folded balun may act as an inductor connected in parallel with the resonating capacitance, and connected to the antenna at a pair of interior nodes or taps of the inductor. The resulting parallel resonance can then be used advantageously to increase the bandwidth of the antenna. Capacitance may be added in series with the unbalanced feed of the feed circuit to match the antenna impedance. By using a center-tapped inductor structure, the feed circuit may use more practical component values, e.g., larger inductors and smaller capacitors. According to a preferred embodiment, a pair of coupled feed circuits for elements of a quadrifilar helix antenna include four sector-shaped conductive regions formed on a substrate. A shorting plane, e.g., a ground plane, is formed on an opposite side of the substrate and is connected to peripheral portions of the sector-shaped regions to form inductors for the feed circuits. Unbalanced transmission lines formed over the outside surface of the conductive regions may be used to impose a balanced field across the terminals of the inductors.

In particular, according to the present invention, a feed circuit is operative to connect an antenna to a communications circuit to achieve increased operating bandwidth. The feed circuit includes a folded balun having a balanced port configured to connect to the antenna and an unbalanced port configured to connect to the communications circuit, and a resonating capacitance connected across the balanced port of the folded balun, the resonating elements having values that provide increased operating bandwidth. The nominal operating frequency range may include a nominal operating frequency having a corresponding nominal operating wavelength, and the folded balun may have an electrical length substantially less than one quarter of the nominal operating wavelength. A series capacitance may be connected in series with an unbalanced feed connection of the folded balun. In equivalent circuit terms, the folded balun may be seen as comprising an inductor connected in parallel combination with the resonating capacitor, the balanced port of the folded balun comprising a pair of interior nodes of the inductor.

According to an embodiment of the present invention, the feed circuit further comprises a substrate having a first side and a second side opposite the first side, and the folded balun comprises a first conductive region on the first side of the substrate and spaced-apart second and third conductive regions on the second side of the substrate, overlying the first conductive region. The second and third conductive regions have first edges adjacent a gap therebetween and are connected to the first conductive region through the substrate by respective first and second conductive paths at respective second edges thereof. The second and third conductive regions may comprise respective opposing conductive sector-shaped regions, with the first conductive region being connected to respective outer portions of the opposing conductive sector-shaped regions by respective first and second pluralities of conductive paths, e.g., first and second groups of plated-through holes. The first, second and third conductive regions and the first and second pluralities of conductive paths may define an electrically small cavity-backed slot antenna.

In an embodiment according to the present invention, a feed circuit for connecting an antenna to a feed includes a first capacitor. An inductor is connected in a parallel combination with the first capacitor and configured to connect to the antenna at a pair of interior nodes thereof. The inductor can be formed by the structure of the folded balun. A second capacitor is configured to be connected in series with the feed and with the parallel combination of the first capacitor and the inductor.

In another embodiment according to the present invention, the circuit includes a substrate having a first side and a second side opposite the first side. The inductor comprises a first conductive region on the first side of the substrate, and spaced-apart second and third conductive regions on the second side of the substrate, overlying the first conductive region, the second and third conductive regions having first edges adjacent a gap therebetween and connected to the first conductive region through the substrate by respective first and second conductive paths at respective second edges thereof.

In another embodiment according to the present invention, the second and third conductive regions comprise respective opposing conductive sector-shaped regions. The first conductive region is connected to respective outer portions of the opposing conductive sector-shaped regions by respective first and second pluralities of conductive paths, e.g., plated-through holes. According to another aspect of the present invention, the first, second and third conductive regions and the first and second pluralities of conductive paths define a cavity-backed slot antenna.

In another embodiment according to the present invention, a feed circuit is provided for an antenna such as a quadrifilar helix antenna comprising first and second pairs of elements. The feed circuit includes a first capacitor and a first inductor connected in a parallel combination with the first capacitor and configured to connect to the first pair of antenna elements of the antenna at a pair of interior nodes of the first inductor. The inductor can be formed in the structure of a second folded balun. A first series capacitor is configured to be connected in series with a first feed and with the parallel combination of the first capacitor and the first inductor. The feed circuit also includes a second capacitor and a second inductor connected in a parallel combination with the second capacitor and configured to connect to the second pair of antenna elements of the antenna at a pair of interior nodes of the second inductor. The second inductor can be formed in the structure of a second folded balun. A second series capacitor is configured to be connected in series with a second feed and with the parallel combination of the second capacitor and the second inductor.

In another embodiment according to the present invention, the feed circuit includes a substrate having a first side and a second side opposite the first side. The first inductor comprises a first conductive region on the first side of the substrate and spaced-apart second and third conductive regions on the second side of the substrate, overlying the first conductive region. The second and third conductive regions have first edges adjacent a gap therebetween and are connected to the first conductive region through the substrate by respective first and second conductive paths at respective second edges thereof. The second inductor comprises the first conductive region, and spaced-apart fourth and fifth conductive regions on the second side of the substrate, overlying the first conductive region. The fourth and fifth conductive regions have first edges adjacent a gap therebetween and are connected to the first conductive region through the substrate by respective third and fourth conductive paths at respective second edges thereof.

In another embodiment, the second and third conductive regions may comprise respective opposing first and second conductive sector-shaped regions. The first conductive region is connected to respective outer portions of the opposing first and second conductive sector-shaped regions by respective first and second pluralities of conductive paths, e.g., plated-through holes. The fourth and fifth conductive regions comprise respective opposing third and fourth conductive sector-shaped regions disposed transverse to the first and second conductive sectors-shaped regions to thereby define a substantially circular region. The first conductive region is connected to respective outer portions of the opposing third and fourth conductive sector-shaped regions by respective third and fourth pluralities of conductive paths, e.g., plated-through holes. The first and second capacitors may each include four capacitors connecting respective adjacent ones of the first, second, third and fourth conductor sector-shaped regions. According to another aspect, the first conductive region, the first, second, third and fourth conductive sector-shaped regions, and the first, second, third and fourth pluralities of conductive paths define an electrically small cavity-backed crossed-slot antenna. A compact feed circuit suitable for driving an antenna such that the feed circuit/antenna combination is capable of wideband and dual-band response is thereby provided.

DETAILED DESCRIPTION OF PREFERRED EMBODIMENTS

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements throughout.

The discussion herein describes embodiments according to the present invention, in particular, with reference to quadrifilar helix antenna applications. Those skilled in the art will appreciate, however, that the present invention is not restricted to quadrifilar helix applications. For example, the present invention is also applicable to antenna circuits including balanced radiators with series resonant impedance characteristics, such as the familiar dipole antenna in its many forms.

Figure 1:
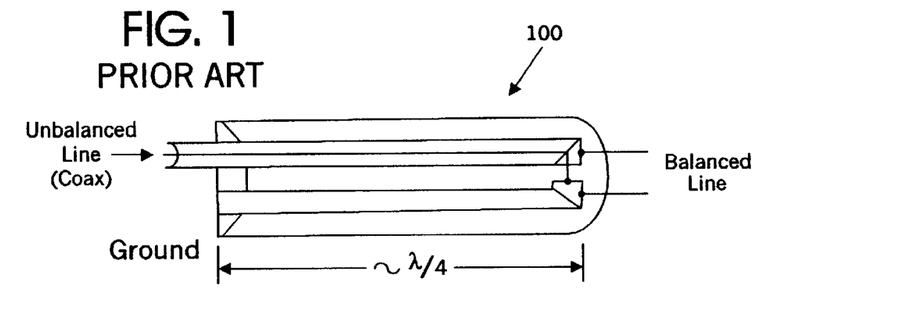
FIG. 1 illustrates a folded balun circuit according to the prior art.

The present invention may be viewed as a novel and nonobvious variation of a folded balun. As shown in FIG. 1, a folded balun according to the prior art may include two parallel conductors connected at one end to the balanced line and shorted by a ground connection at the unbalanced end of the balun circuit. These conductors are typically designed to be a quarter wavelength ($\lambda/4$) long at some nominal center frequency so that the shunt susceptance on the balanced line is minimal. In addition, the transmission line impedance of the two parallel conductors is usually designed to be as high as possible to minimize the deviation from zero susceptance across the required bandwidth. To make the balun smaller, one could reduce its length and bring the conductors closer together. As a result, however, an inductive susceptance across the balanced output tends to grow and become undesirably large.

Figure 2A:
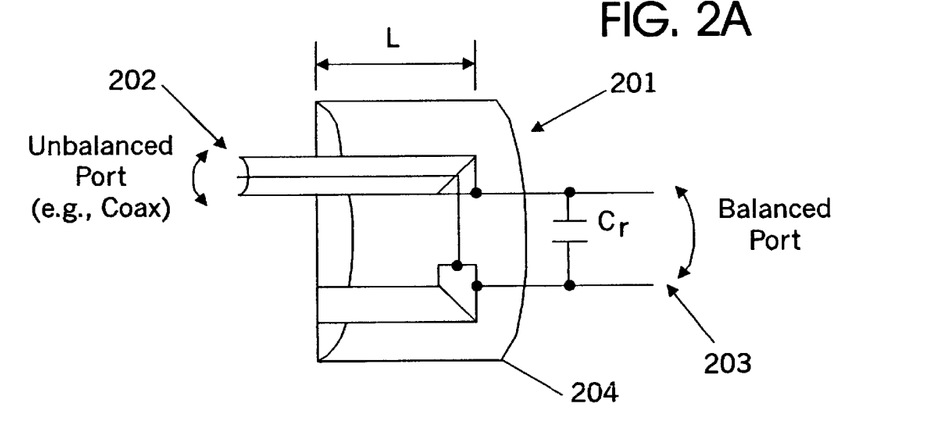
FIGS. 2A and 2B are schematic illustrations of an embodiment of a combined balun and parallel resonant circuit according to the present invention.

The present invention arises from the realization that one can add capacitive susceptance in parallel and create a parallel resonant circuit to overcome the inductive susceptance across the balanced output of a balun circuit, allowing the balun circuit to operate advantageously over a band of frequencies. Such a modified balun is illustrated in FIG. 2A. A shortened folded balun 201 has an unbalanced port 202 such as a coax feed, and a balanced port 203. A parallel capacitance $C_r$ is connected to the balun 201 across the balanced port 203. The balun 201 has an electrical length L that can be made substantially less that one-fourth the nominal operating wavelength of the combination of the feed circuit and the elements it connects, e.g., an antenna and a communications circuit such as a transmitter and/or a receiver. A shield 204 may surround the folded balun.

Figure 2B:
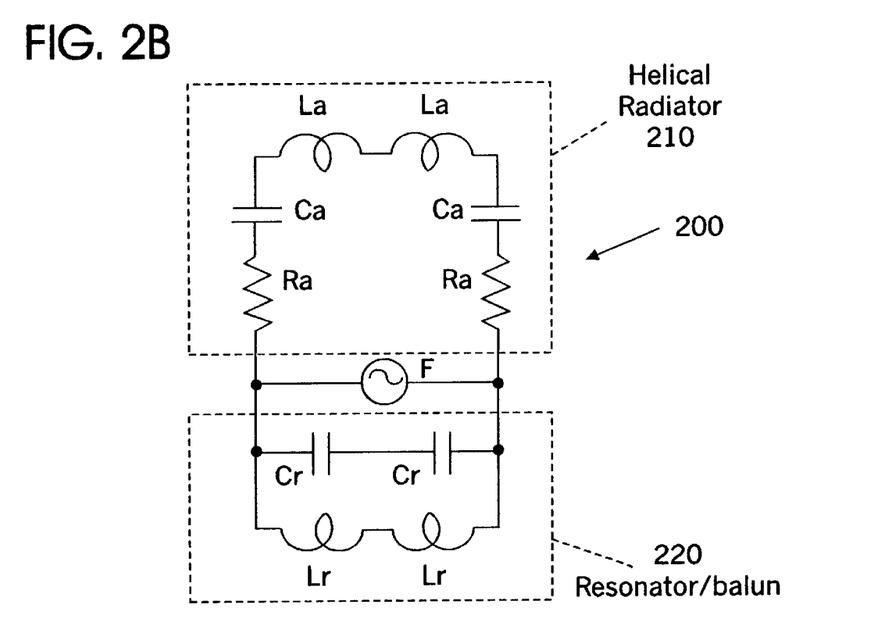

FIG. 2B illustrates an equivalent circuit for the folded balun of FIG. 2A. In FIG. 2B, components of an antenna circuit 200 fed by a source F are mirrored on opposite sides of a centerline to represent the balanced nature of the equivalent circuit. Performance of a helical radiator 210 is represented reasonably well over the band of interest as a series RLC circuit, including a resistance $R_a$, an inductance $L_a$, and a capacitance $C_a$. The equivalent circuit illustrated in FIG. 2B represents one pair of radiating elements, for example, two opposing conductors of a quadrifilar helix antenna; an identical but independent diagram may be used to illustrate another pair of conductors of the quadrifilar helix. The resonator/balun 220 includes an inductor $L_r$ (which may in fact be implemented as the two parallel conductors of FIGS. 1 and 2A) and a resonating capacitance $C_r$. The inductance $L_r$ desirably is very small, and the resonating capacitance $C_r$ desirably is large.

Figure 3:
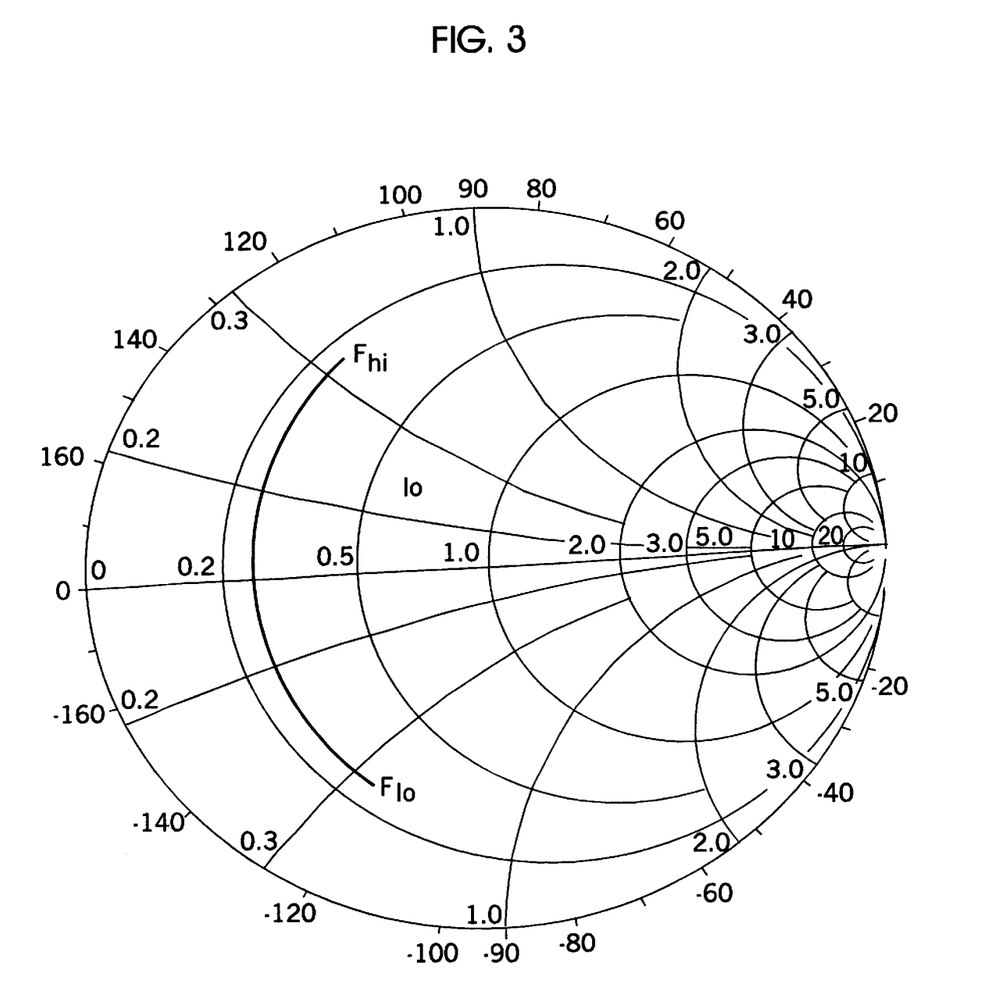
FIG. 3 is a Smith Chart impedance plot of a quadrifilar helix antenna.
Figure 4:
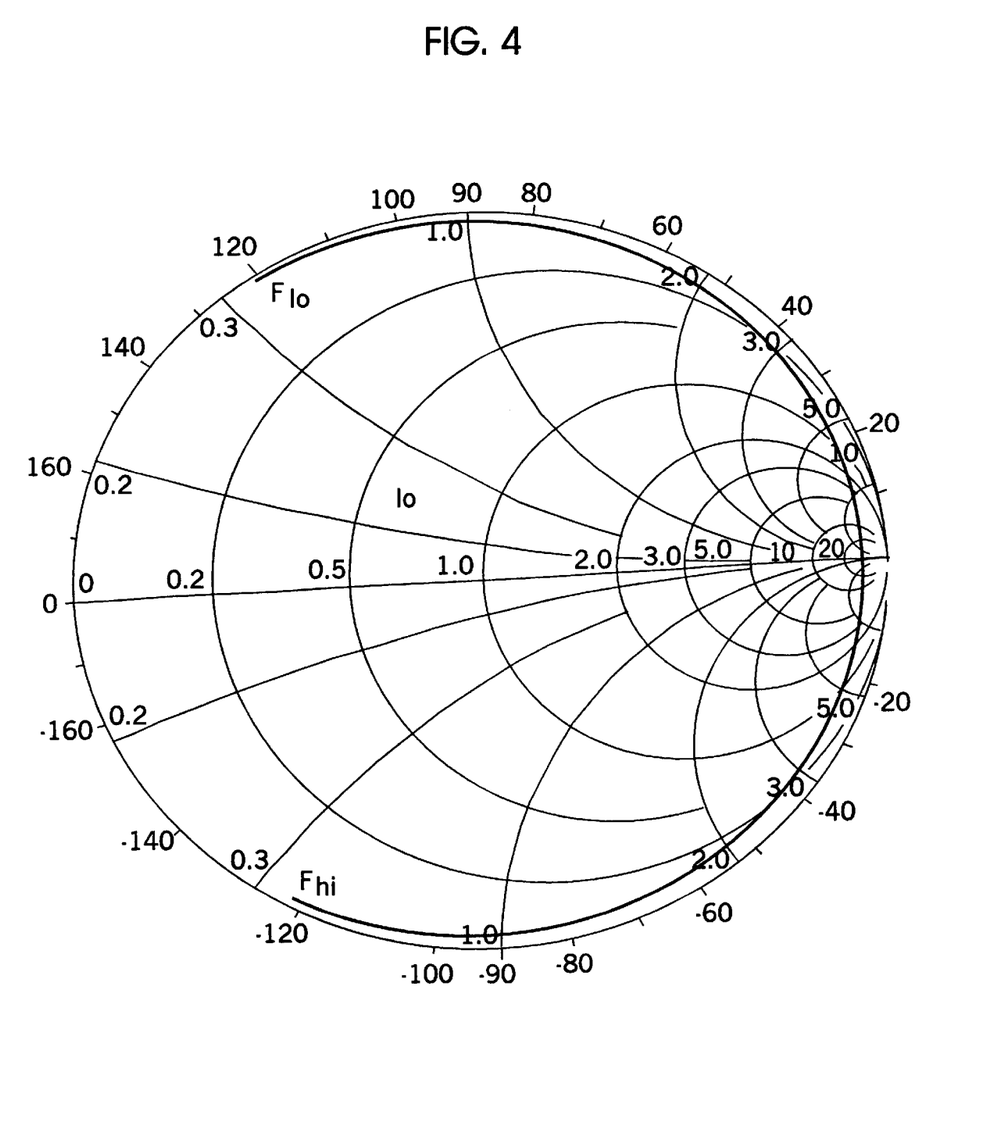
FIG. 4 is a Smith Chart impedance plot of a parallel resonant circuit including a balun and a resonating capacitor.
Figure 5:
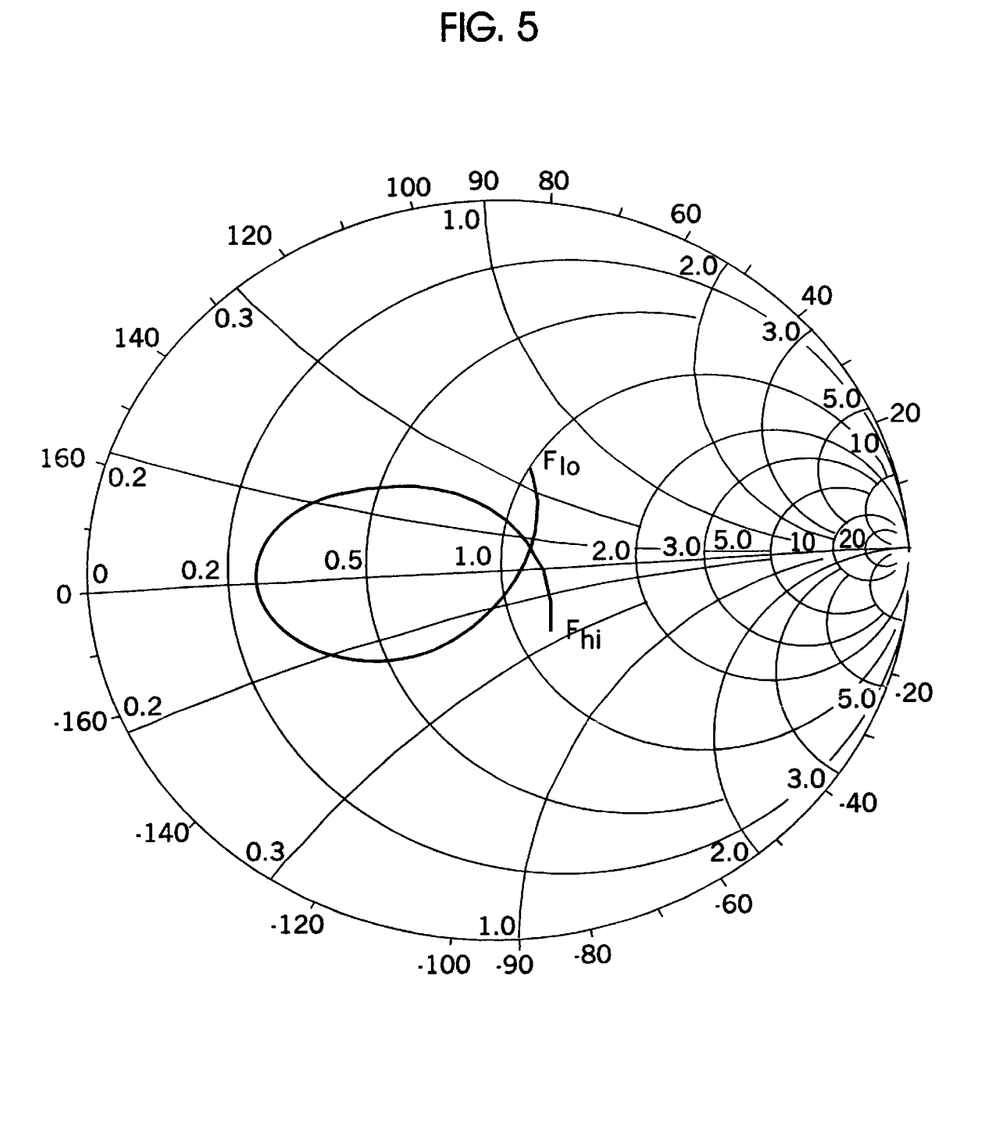
FIG. 5 is a Smith Chart impedance plot of a combination of the quadrifilar helix antenna of FIG. 3 and the parallel resonant circuit of FIG. 4.

FIG. 3 is a Smith Chart impedance plot illustrating a locus $F_{lo}$–$F_{hi}$ for a typical quadrifilar helix antenna. FIG. 4 is a Smith Chart plot illustrating a locus $F_{lo}$–$F_{hi}$ for a parallel resonant circuit including a very low inductance balun and a very high capacitance resonating capacitor. When a quadrifilar helix having the characteristic illustrated in FIG. 3 is coupled to a parallel resonant circuit having the characteristic illustrated in FIG. 4, the resulting impedance is as illustrated in the Smith Chart plot of FIG. 5. The ends of the locus $F_{lo}$–$F_{hi}$ crossing each other near the center of the Smith Chart provides a dual band response.

An issue in fabricating such a small balun circuit is how to make the circuit capable of being repeatably manufactured using practical components and manufacturing processes. In a typical L-Band application, the inductance typically required to provide a useful broad band or dual band response may be on the order of 0.25 nH. An inductor having such an inductance value typically is extremely small and difficult to manufacture with the kind of tolerances (approximately 1 or 2%) typically required. Furthermore, the resonating capacitor would tend to be on the order of 40 pF, and thus typically a special capacitor would be needed to avoid undesirable self-resonance.

Figure 6:
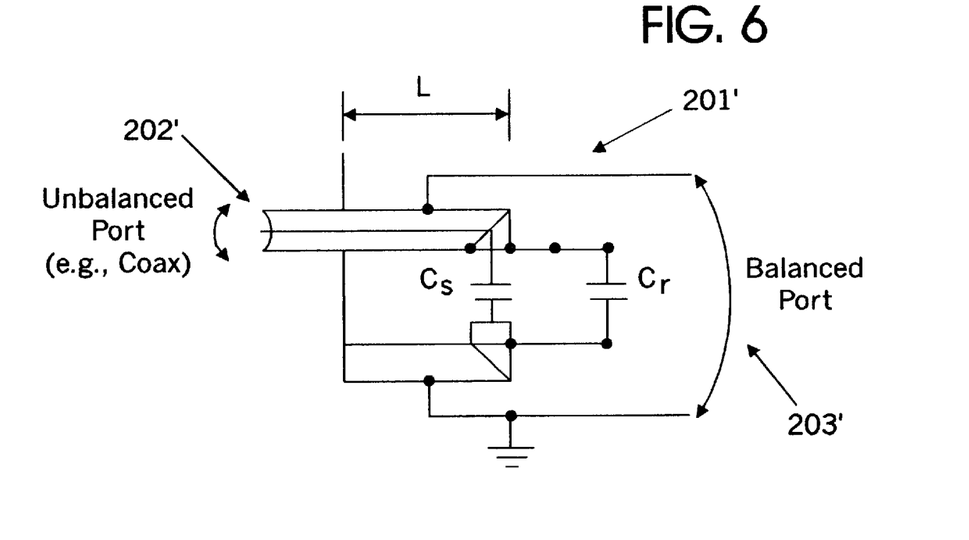
FIG. 6 is a schematic illustration of an antenna feed circuit according to the present invention.

The shield 204 around the parallel conductors in FIG. 2A is not always necessary, particularly when the length of the balun becomes very short. If the shield 204 is removed, it is possible to connect the balanced port 203' of a modified balun 201' at positions on the parallel conductors closer to the unbalanced port 202' of the modified balun 201' of length L, as shown in FIG. 6. Tapping in this way may change the values of the inductor and capacitor $C_r$ needed to maintain the desired effect of the resonant circuit. The inductor can easily be an order of magnitude larger, and the capacitor can be smaller by the same factor. Accordingly, the circuit may be more easily implemented using practical component values. Because the impedance of the antenna may be transformed to a level that is typically much higher than 50 ohms, the resonator components may be readjusted so that the impedance at the center frequency is just slightly inductive, thereby moving the Smith chart impedance plot to a point where a series capacitor $C_s$ can be used to match the desired bandwidth.

Figure 7:
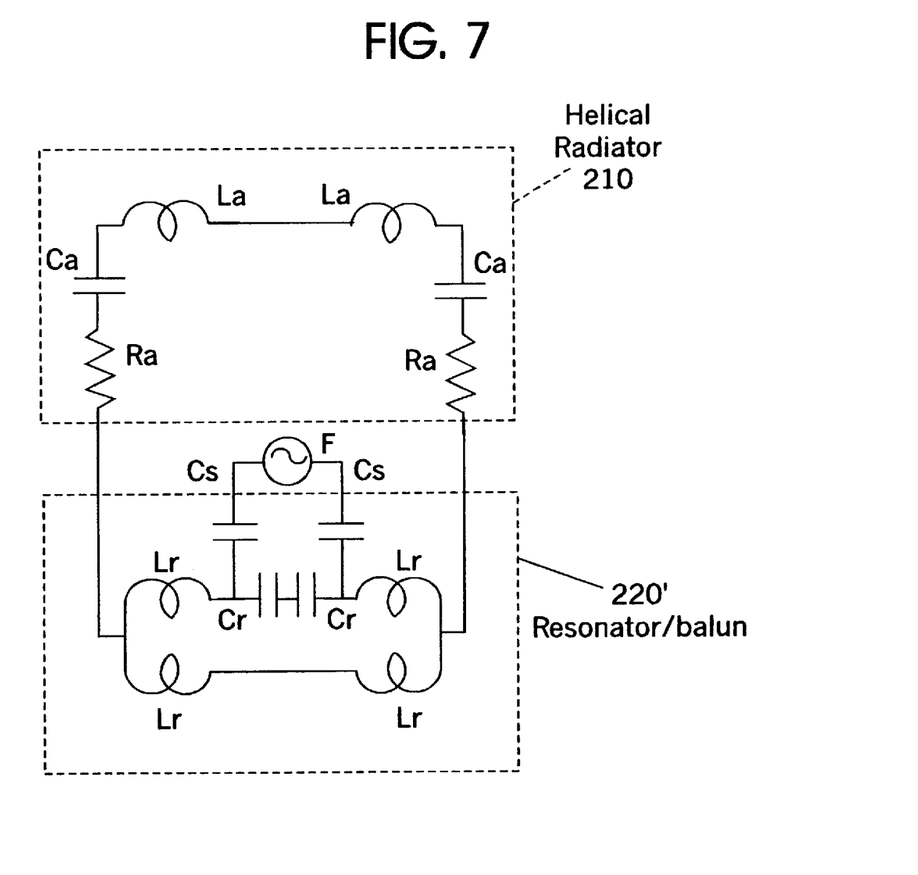
FIG. 7 illustrates an equivalent circuit for the antenna circuit of FIG. 6.

An equivalent circuit for the structure of FIG. 6 is shown in FIG. 7. The components of the helical radiator 210 are the same as described with respect to FIG. 2B, i.e., like elements being denote like reference numerals. However, the helical radiator 210 is now connected at tapped points on the on an inductor $L_r'$ of a modified resonator/balun circuit 220'. The inductor $L_r'$ may still be implemented using two parallel conductors, but the value of the inductance required may now be large enough to be more repeatably manufactured. Similarly, the resonating capacitance $C_r$ may be made small enough that self-resonance is advantageously avoided; for example, the resonating capacitance for a typical L-Band application may be on the order of 3 pF. Series capacitance $C_s$ may be added to match the desired bandwidth.

Figure 8:
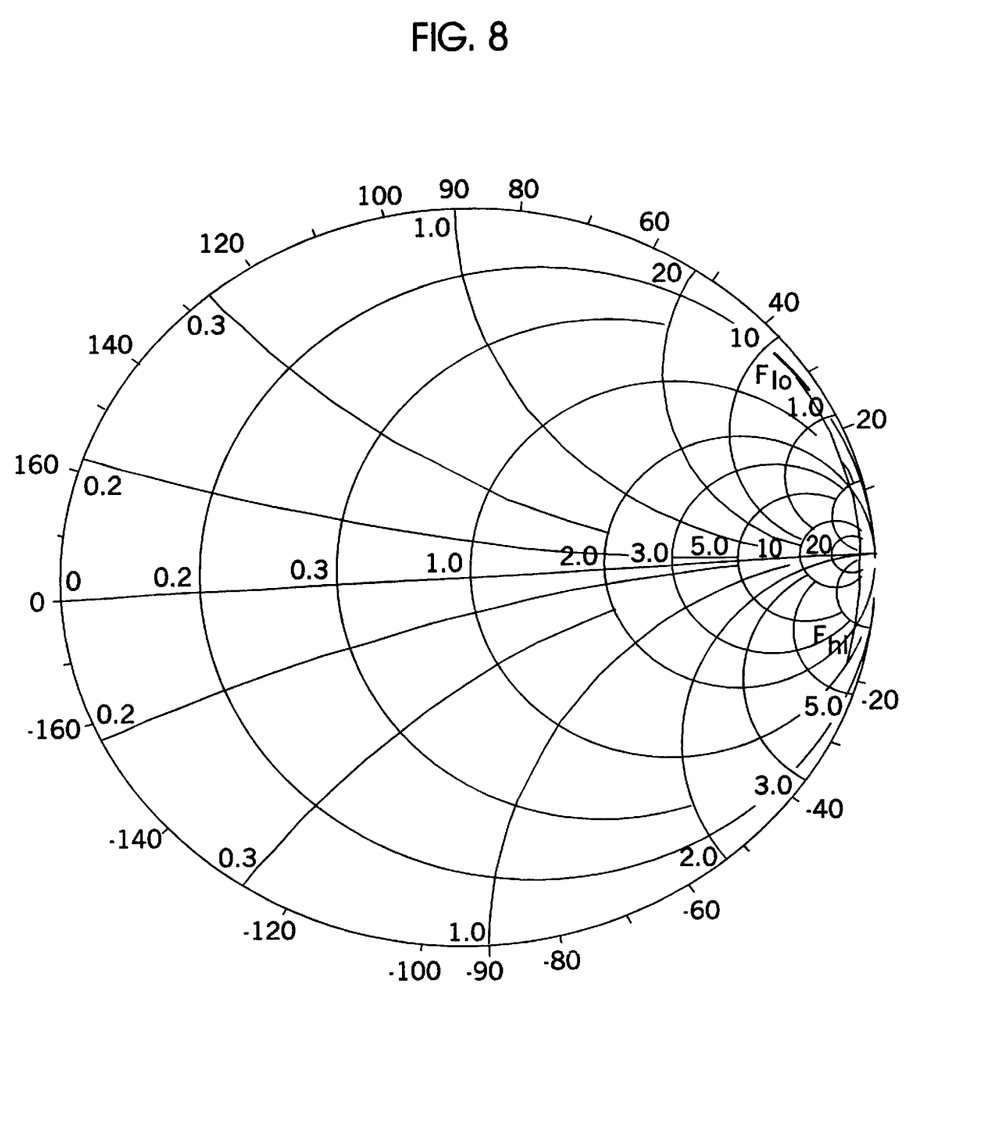
FIG. 8 is a Smith Chart impedance plot of a parallel resonant circuit including a tapped inductor according to an embodiment of the present invention.
Figure 9:
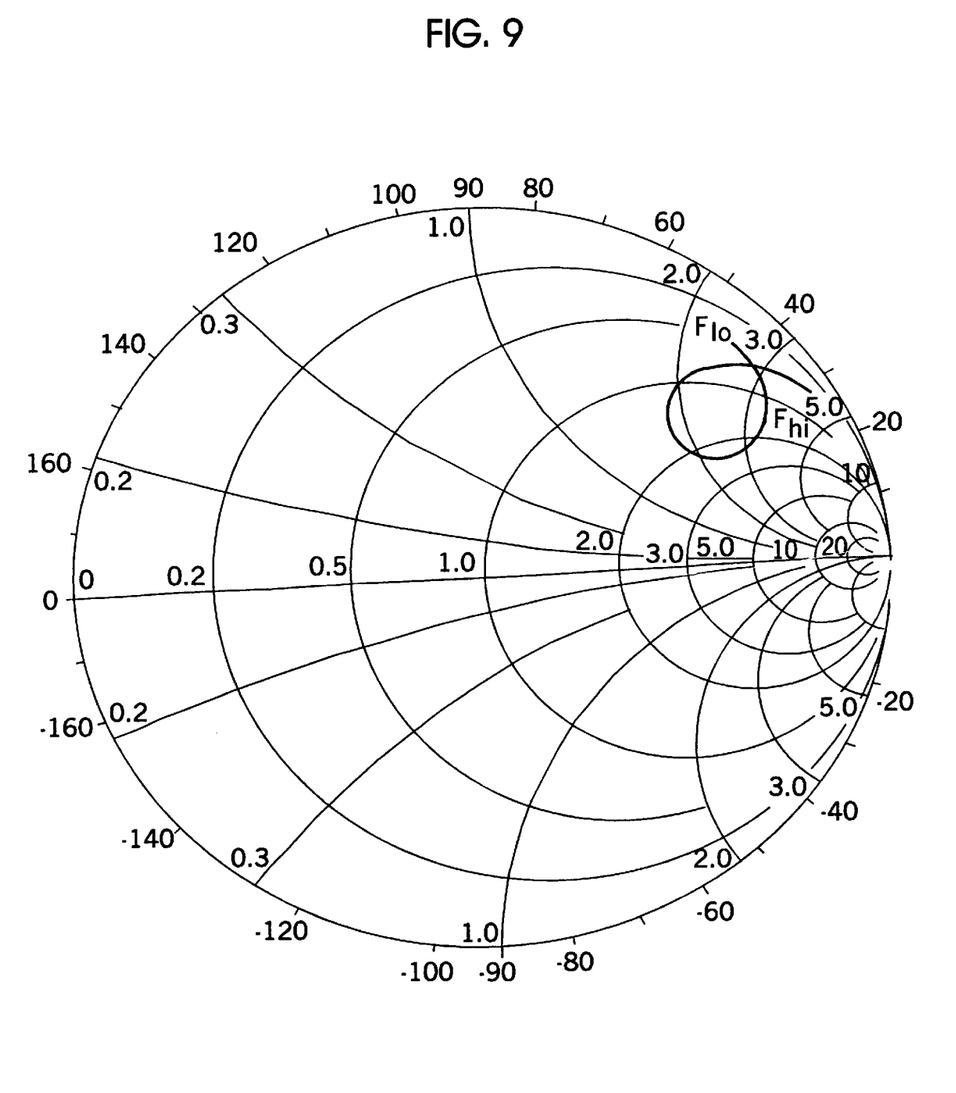
FIG. 9 is a Smith Chart impedance plot of the combination of the parallel resonant circuit of FIG. 8 and the quadrifilar helix antenna of FIG. 3.
Figure 10:
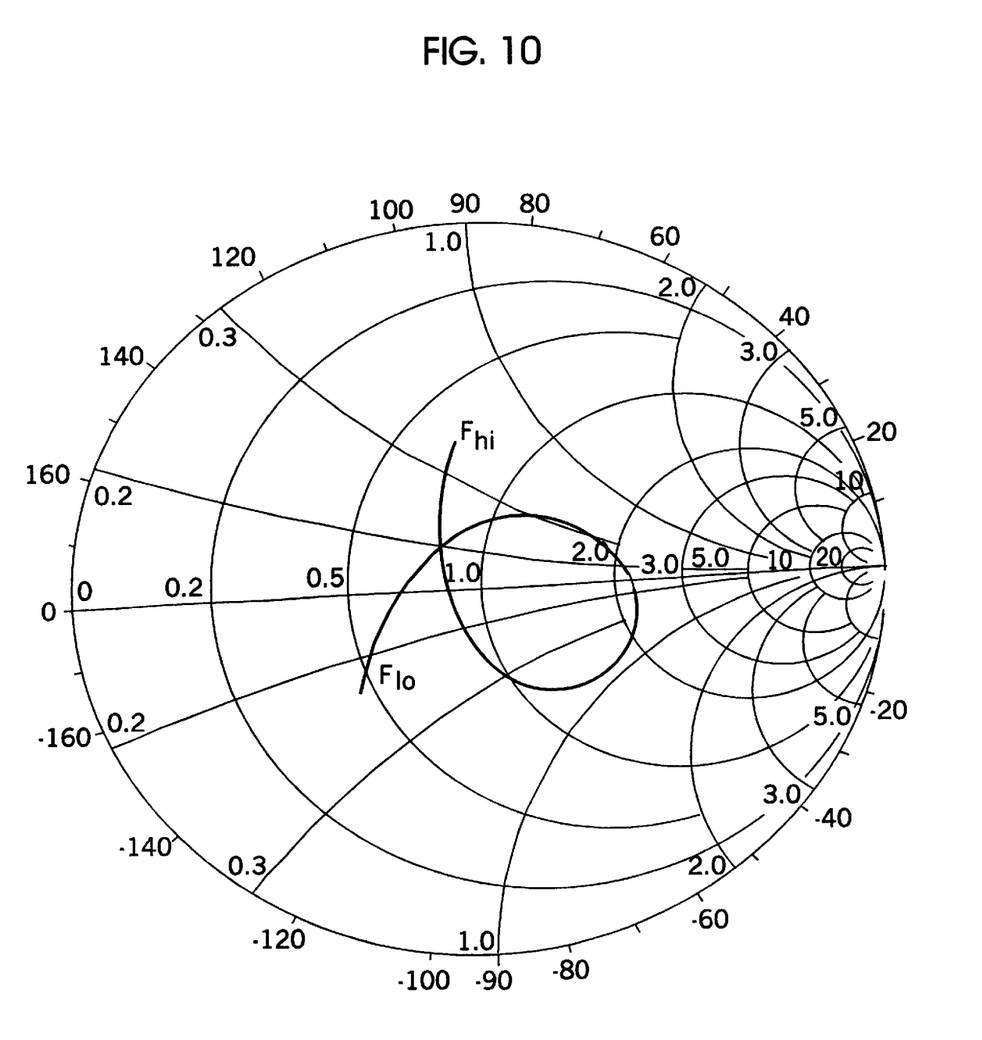
FIG. 10 is a Smith Chart impedance plot of the combination of the parallel resonant circuit and quadrifilar helix of FIG. 9 in further combination with a series capacitor according to another embodiment of the present invention.

Performance of such a modified antenna circuit is illustrated in the Smith Chart plots of FIGS. 8–10. FIG. 8 illustrates a parallel resonant circuit in which a tapped inductor is used, illustrating how by tapping the inductor as described above, the Q of the resonant circuit can be greatly reduced to produce an impedance locus $F_{lo}$–$F_{hi}$. As illustrated by FIG. 9, when a quadrifilar helix is connected at the tap points, the impedance locus $F_{lo}$–$F_{hi}$ is transformed to a much higher impedance than the plot of FIG. 5. As illustrated in FIG. 10, the center of the locus $F_{lo}$–$F_{hi}$ may be moved back to the center of the Smith Chart with the addition of a series capacitor.

There are a number of ways to implement the circuits described in the preceding paragraphs. A preferred embodiment is implemented on a printed circuit board or similar substrate. To make the structure such as that illustrated in FIG. 7 according to this embodiment, the coaxial line inside one of the parallel conductors may be changed to a microstrip line. The length of the two parallel conductors may be reduced to the thickness of a printed circuit board, about 0.063 inch for the L-Band application. This allows the two parallel conductors to be implemented as two groups of plated-through holes. The resulting inductance may be made quite small and no longer dominated by the two parallel conductors, but instead by the conductors attached to them, i.e., the conductors that form the short (e.g., ground) on the unbalanced side of the balun and which provide the transmission line reference on the balanced side of the balun. These conductors may be fabricated as printed circuit features. A second balun, similar to the first but rotated 90 degrees on a common center, may be integrated to provide a four-phase feed for a quadrifilar helix. This may also be done with the structure of FIG. 1, incorporating four parallel conductors, two unbalanced inputs and two balanced output pairs.

Figure 11:
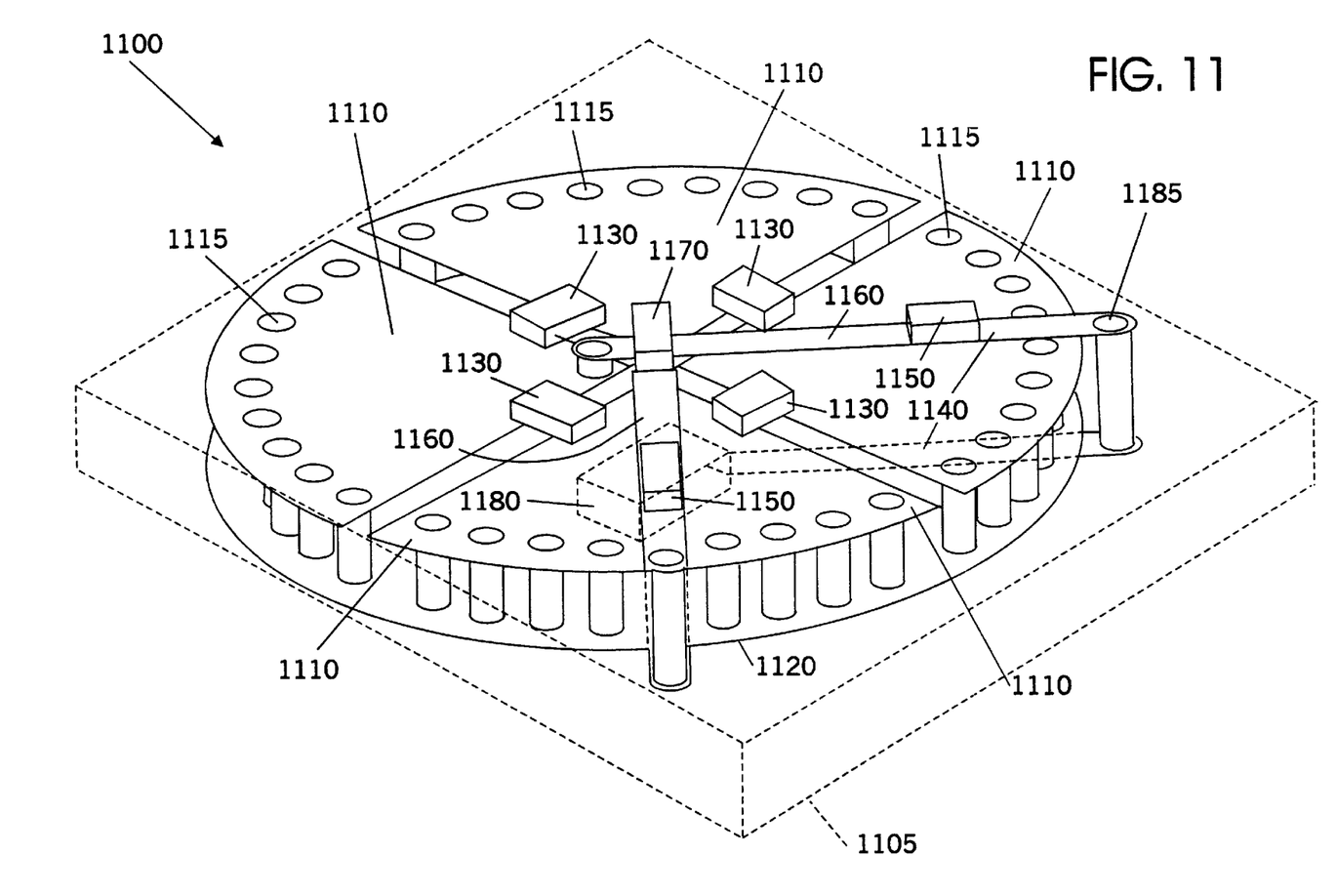
FIG. 11 illustrates a preferred embodiment of an antenna circuit according to the present invention.
Figure 12:
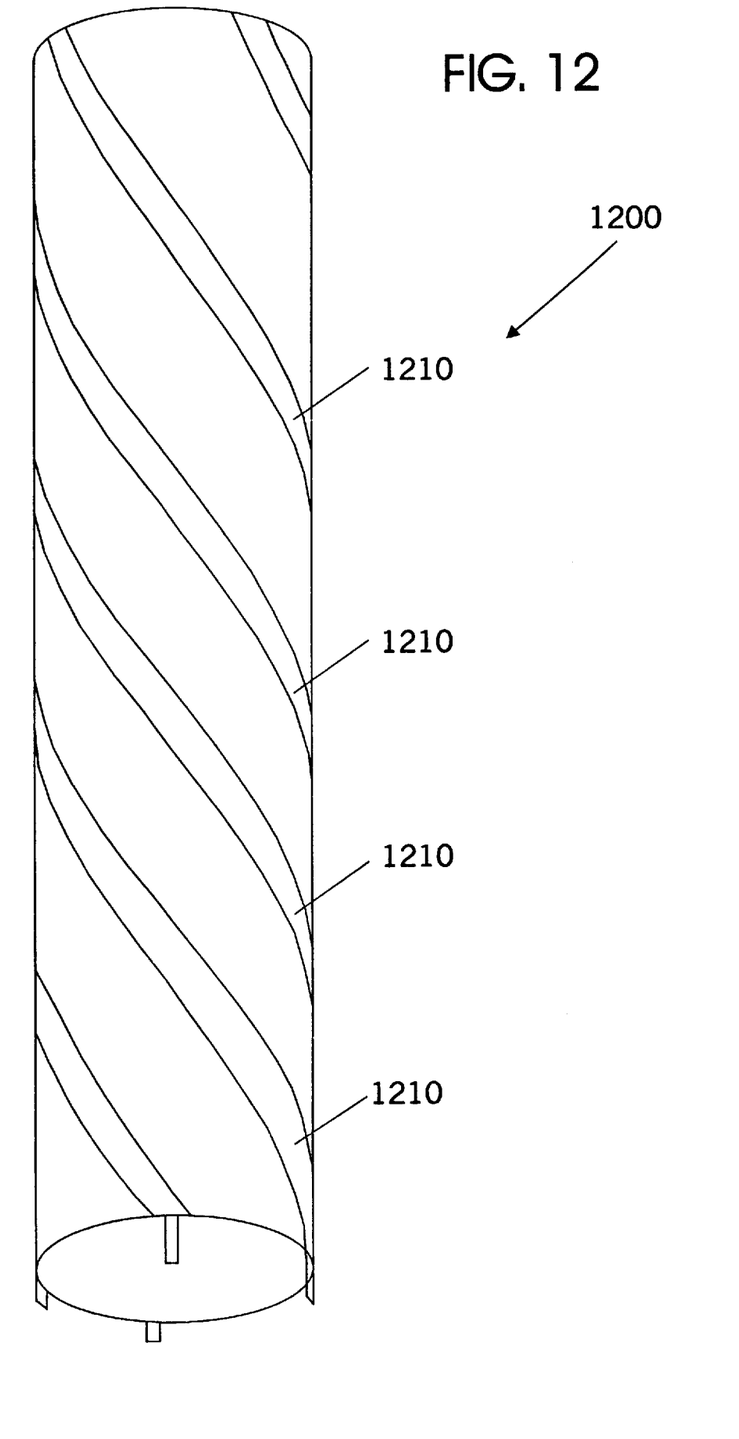
FIG. 12 illustrates a quadrifilar helix antenna for use with the antenna circuit of FIG. 11.

Applying this geometry to the printed circuit configuration described in the preceding paragraph can result in the cylindrical structure 1100 illustrated in FIG. 11. Four pie-shaped sector regions 1110 are formed on a top surface of a substrate, e.g., a multi-layer printed circuit board 1105. The sector regions 1110 are configured to attach, for example, to elements 1210 of the quadrifilar helix antenna 1200 illustrated in FIG. 12. Four groups of plated-through holes 1115 are formed around the circumference of the cylinder defined by the sector regions 1110, and provide a plurality of conductive paths that connect the four sector regions 1110 to a shorting plane 1120 formed on the backside of the circuit board 1105. Each of the two orthogonal conductive paths thus formed serve as an inductance in the resonator circuit of FIG. 7. The diameter of the cylinder defined by the sector regions 1110 preferably is approximately equal to the diameter of the helical antenna 1200 so that the helical elements 1210 contact the resonator inductors formed by the plated-through holes 1115 near the edge of the cylinder. This can serve as an advantageous tap point for achieving the desired resonance conditions with practical components, as described above.

The resonating capacitance may be formed by placing capacitors across the gaps between opposing sector regions 1110. However, this arrangement may lead to the location of an excessive number of components and circuit features at the center of the circular structure. To simplify the layout, a respective capacitor 1130 may be installed across a respective gap separating adjacent sector regions 1110. The capacitors 1130 preferably are still located near the center, but need not be at the center. In this configuration, the equivalent capacitance between any two opposing pie-shape conductors is a combination of two of the capacitors 1130 in series, combined in parallel with a second set of the capacitors 1130 in series, preferably all of approximately equal value.

In this four-phase feed circuit, respective feed lines 1140 feed respective series capacitors 1150. The series capacitors 1150 are also connected to the sector regions 1110 via lines 1160 which cross each other at the center of the circuit. This may be accomplished by etching one line and using a very low resistance resistor 1170 as a jumper for the other line. From the point of crossing, these lines may be microstrip lines having a ground plane reference which is the pie-shaped sector region 1110 below them.

It may be advantageous to bring the feed lines 1140 around to the backside of the board 1105 where they can connect to a small quadrature hybrid 1180. To accomplish this, a plated-through hole 1185 can be used to connect a microstrip line on one side of the board 1105 to another microstrip line on the other side of the board 1105. Preferably, this hole is located outside the plated-through holes 1115, which incidentally also can provide the ground reference for the plated-through hole connection as it passes across the edge of the cylindrical structure.

The printed circuit feed structure described above may be viewed as an electrically small cavity-backed crossed-slot antenna (i.e., a combination of two cavity backed slot antennas), coupled to a quadrifilar helix, wherein the cavity is the cylindrical structure defined by the plated-through holes 1115 and the shorting plane 1120, and the slots are the gaps between the sector regions 1110. It may be observed that that the slots are substantially shorter than a half wavelength and therefore utilize the four shunt capacitors 1130 to achieve resonance. The coupling to the helix may be controlled by appropriately selecting the point at which the helical conductors are connected to the cavity structure. Accordingly, the present invention may also be characterized as a novel and nonobvious combination of a feed circuit which is a very high Q antenna that can be implemented in a variety of ways, such as by using a microstrip patch. To achieve the very high Q in such an implementation, it may be desirable use a very high dielectric constant, in the range of 30 to 100.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A parallel resonant feed circuit for connecting an antenna to a feed, comprising:

a first inductance configured to connect in parallel with an antenna at first and second nodes;

a second inductance connected to said first inductance at said first node;

a third inductance connected to said first inductance at said second node;

a first capacitance connected to said second inductance at a third node and connected to said third inductance at a fourth node;

a second capacitance, connected to said first capacitance at said third node; and an unbalanced transmission line feed with a center conductor connected to said second capacitor at a fifth node and a ground reference connected to said fourth node.

2. A circuit according to claim 1, wherein said first, second and third inductances are provided by a pair of parallel conductors disposed on a substrate.

3. A feed circuit for connecting an antenna to a communications circuit, the feed circuit comprising:

a folded balun having a balanced port configured to connect to the antenna and an unbalanced port configured to connect to the communications circuit;

a resonating capacitance connected across said balanced port of said folded balun; and a series capacitance connected in series with said unbalanced port.

4. A feed circuit according to claim 3, wherein said folded balun comprises:

an inductor connected in parallel combination with said resonating capacitor, said inductor having a first node, a second node, and third and fourth nodes of a portion of said inductor coupling said first node of said inductor to said second node of said inductor, wherein said inductor is connected to said resonating capacitor at said first and second nodes of said inductor, and wherein said balanced port of said folded balun comprises said third and fourth nodes of said inductor.

5. A feed circuit according to claim 3, further comprising a substrate having a first side and a second side opposite said first side, and wherein said folded balun comprises:

a first conductive region on said first side of said substrate; and spaced-apart second and third conductive regions on said second side of said substrate, overlying said first conductive region, said second and third conductive regions having first edges adjacent a gap therebetween and connected to said first conductive region through said substrate by respective first and second conductive paths at respective second edges thereof.

6. A feed circuit according to claim 5, wherein said second and third conductive regions comprise respective opposing conductive sector-shaped regions, and wherein said first conductive region is connected to respective outer portions of said opposing conductive sector-shaped regions for respective first and second pluralities of conductive paths.

7. A feed circuit according to claim 6, wherein said first, second and third conductive regions and said first and second pluralities of conductive paths define a cavity-backed slot antenna.

8. A feed circuit according to claim 3, wherein said folded balun has an electrical length substantially less than one quarter of an operating wavelength of a combination of the feed circuit and the antenna when the antenna is connected to the balanced port of the folded balun.

9. A feed circuit for connecting an antenna to a feed, the circuit comprising:

a first capacitor;

an inductor connected in a parallel combination with said first capacitor, said inductor having a first node, a second node and third and fourth nodes of a portion of said inductor coupling said first node of said inductor to said second node of said inductor, wherein said inductor is connected to said first capacitor at said first and second nodes of said inductor and wherein said inductor is configured to connect to the antenna at said third and fourth nodes of said inductor; and a second capacitor configured to be connected in series with the feed and with the parallel combination of the first capacitor and the inductor.

10. A circuit according to claim 9, wherein said inductor comprises a pair of parallel conductors.

11. A circuit according to claim 10, further comprising a substrate having a first side and a second side opposite said first side, and wherein said inductor comprises:

a first conductive region on said first side of said substrate; and spaced-apart second and third conductive regions on said second side of said substrate, overlying said first conductive region, said second and third conductive regions having first edges adjacent a gap therebetween and connected to said first conductive region through said substrate by respective first and second conductive paths at respective second edges thereof.

12. A circuit according to claim 11, wherein said second and third conductive regions comprise respective first and second opposing conductive sector-shaped regions, and wherein said first conductive region is connected to respective outer portions of said first and second opposing conductive sector-shaped regions by respective first and second pluralities of conductive paths.

13. A circuit according to claim 12, wherein said first, second and third conductive regions and said first and second pluralities of conductive paths define a cavity-backed slot antenna.

14. A feed circuit for an antenna, the circuit comprising:

a first capacitor;

a first inductor connected in a parallel combination with said first capacitor, said first inductor having a first node, a second node, and third and fourth nodes of a portion of said first inductor coupling said first node of said first inductor to said second node of said first inductor, wherein said first inductor is connected to said first capacitor at said first and second nodes of said first inductor, and wherein said first inductor is configured to connect to a first pair of antenna elements of the antenna at said third and fourth nodes of said first inductor;

a first series capacitor configured to be connected in series with a first feed and with the parallel combination of the first capacitor and the first inductor;

a second capacitor;

a second inductor connected in a parallel combination with said second capacitor, said second inductor having a first node, a second node, and third and fourth nodes of a portion of said second inductor coupling said first node of said second inductor to said second node of said second inductor, wherein said second inductor is connected to said second capacitor at said first and second nodes of said second inductor and wherein said second inductor is configured to connect to a second pair of antenna elements of the antenna at said third and fourth nodes of said second inductor; and a second series capacitor configured to be connected in series with a second feed and with the parallel combination of the second capacitor and the second inductor.

15. A circuit according to claim 14, wherein said first inductor and said second inductor comprise respective pairs of parallel conductors.

16. A circuit according to claim 15, further comprising a substrate having a first side and a second side opposite said first side, and:

wherein said first inductor comprises:
- a first conductive region on said first side of said substrate; and
- spaced-apart second and third conductive regions on said second side of said substrate, overlying said first conductive region, said second and third conductive regions having first edges adjacent a gap therebetween and connected to said first conductive region through said substrate by respective first and second conductive paths at respective second edges thereof; and wherein said second inductor comprises:
- said first conductive region; and
- spaced-apart fourth and fifth conductive regions on said second side of said substrate, overlying said first conductive region, said fourth and fifth conductive regions having first edges adjacent a gap therebetween and connected to said first conductive region through said substrate by respective third and fourth conductive paths at respective second edges thereof.

17. A circuit according to claim 16:

wherein said second and third conductive regions comprise respective opposing first and second conductive sector-shaped regions, and wherein said first conductive region is connected to respective outer portions of said opposing first and second conductive sector-shaped regions by respective first and second pluralities of conductive paths; and wherein said fourth and fifth conductive regions comprise respective opposing third and fourth conductive sector-shaped regions disposed transverse to said first and second conductive sectors-shaped regions to thereby define a substantially circular region, and wherein said first conductive region is connected to respective outer portions of said opposing third and fourth conductive sector-shaped regions by respective third and fourth pluralities of conductive paths.

18. A circuit according to claim 17, wherein said first conductive region, said first, second, third and fourth conductive sector-shaped regions, and said first, second, third and fourth pluralities of conductive paths define a cavity-backed crossed-slot antenna.

19. A circuit according to claim 17, wherein respective ones of said first and second capacitors comprise corresponding sets of four capacitors connecting respective adjacent pairs of said first, second, third and fourth conductor sector-shaped regions.

* * * * *